(12) United States Patent
Yoshimura et al.

(10) Patent No.: US 7,336,757 B2
(45) Date of Patent: Feb. 26, 2008

(54) CHARGE-COUPLED DEVICE

(75) Inventors: Masataka Yoshimura, Ichinomiya (JP); Masaaki Ohashi, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 198 days.

(21) Appl. No.: 11/357,255

(22) Filed: Feb. 21, 2006

(65) Prior Publication Data
US 2006/0186949 A1    Aug. 24, 2006

(30) Foreign Application Priority Data
Feb. 24, 2005    (JP) .............................. 2005-049072

(51) Int. Cl.
*G11C 19/28* (2006.01)
(52) U.S. Cl. .................... 377/63; 348/311; 348/312
(58) Field of Classification Search .................. None
See application file for complete search history.

(56) References Cited

U.S. PATENT DOCUMENTS 6,078,169 A * 6/2000 Petersen ..................... 323/273
6,683,647 B2 * 1/2004 Idouji ......................... 348/312
6,825,879 B1 * 11/2004 Furumiya .................... 348/311
2006/0017831 A1 * 1/2006 Tanaka ........................ 348/311

* cited by examiner

Primary Examiner—Tuan T Lam
(74) Attorney, Agent, or Firm—Oliff & Berridge, PLC

(57) ABSTRACT

A CCD shift register capable of switching between two-phase driving and three-phase driving in which crosstalk among clock signal lines is reduced and a decrease in transfer efficiency is prevented. Transfer electrodes disposed at regular intervals along a channel region are supplied with clock signals through clock signal lines. Three pairs of clock signal lines that are supplied with an in-phase clock signal at three-phase driving are disposed next to each other. One pair of odd-numbered clock signal lines supplied with an in-phase clock signal at two-phase driving is disposed next to each other, and one pair of even-numbered clock signal lines supplied with an in-phase clock signal at two-phase driving is disposed next to each other.

5 Claims, 2 Drawing Sheets

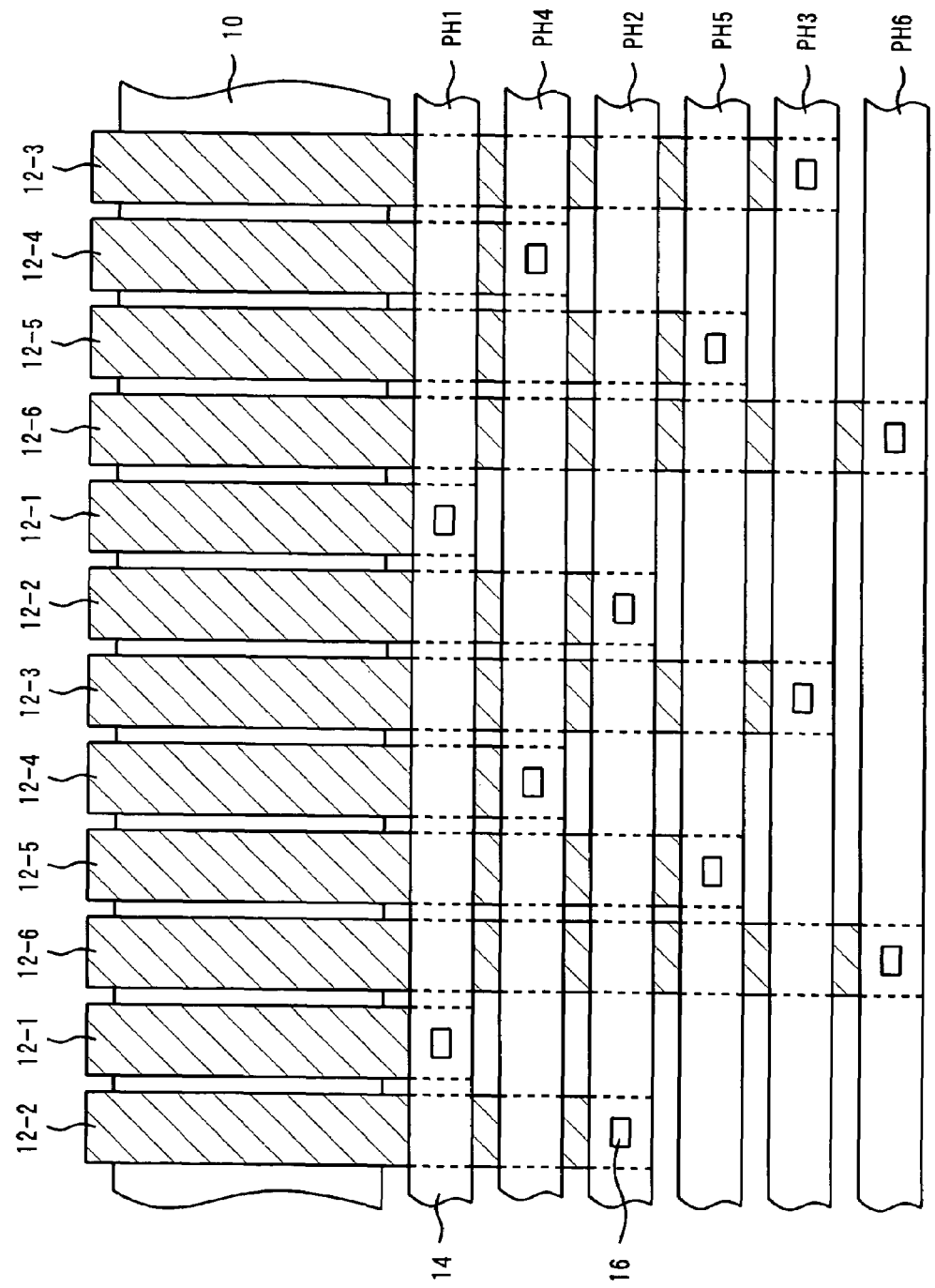

CHARGE-COUPLED DEVICE

CROSS-REFERENCE TO RELATED APPLICATIONS

The priority application number JP2005-049072 upon which this patent application is based is hereby incorporated by reference.

BACKGROUND OF THE INVENTION

1. Field of the Invention

The present invention relates to charge-coupled devices (CCDs) and, in particular, relates to CCDs capable of transferring signal charge while switching multiple driving methods using transfer clocks having different numbers of phases.

2. Description of the Related Art

Mobile phones with a camera function, digital cameras and so on have solid-state image sensing devices with high resolution as high as millions of pixels. Some of the devices have both still-picture photographing and motion photographing functions. Such cameras generally have a display for previewing images to be photographed.

Motion-picture photographing and previewing need high frame rates. However, the time to read signal charge of each pixel from solid-state image sensing devices and the time to process the read signals increase as the number of pixels of the solid-state image sensing devices increases, which makes it difficult to provide high frame rates to the present high-resolution solid-state image sensing devices. In short, although the reading speed and signal processing speed have improved, the present state is not yet enough. Particularly, since CCD image sensors read the signal charge of each pixel sequentially via a horizontal shift register, the horizontal shift register needs to be driven at a clock proportional to the product of the number of pixels and the frame rate, which poses the problems of a decrease in transfer efficiency, an increase in power consumption, and generation of heat.

Motion pictures and preview images do not need resolution as high as that for still pictures. Accordingly, for motion pictures and preview images, the number of charge packets is reduced by addition of the multiple pixels of the image sensing devices, thereby reducing reading time to improve the frame rate.

For example, when photographing still pictures, the charge packets read from a vertical shift register to each bit of the horizontal shift register can be transferred horizontally to the output portion without adding each other. When photographing motion pictures, the charge packets are added into groups of a specified number of packets on the horizontal shift register, and may then be transferred horizontally to the output portion.

FIG. 1 is a schematic plan view of a configuration of a known horizontal shift register. For still-picture photographing, the horizontal shift register horizontally transfers the charge packets read every row from the imaging portion to the output portion by two-phase driving; for motion-picture and previewing-image photographing, the horizontal shift register combines the charge packets read from the imaging portion every three pixels at a time by six-phase driving, and horizontally transfers the combined charge packets to the output portion by three-phase driving.

For the multiple kinds of driving of different numbers of phases, the horizontal shift register is constructed so as to be driven by six-phase clock signals, in which six clock-signal lines are provided along a channel region 2 of the horizontal shift register.

Transfer electrodes 4-1 to 4-6 are disposed at regular intervals in this order on the channel region 2 along the direction in which charge is transferred. Outside the channel region 2, a set of clock signal lines 6 is disposed to provide clocks to the group of transfer electrodes. For two-phase driving, three-phase driving, and six-phase driving, the one set of clock signal lines 6 is composed of six clock signal lines, which are arranged in parallel along the channel region 2.

The transfer electrodes 4-1 to 4-6 connect to the different clock signal lines 6 via a contact 8. Here, a clock signal line 6 connected to a transfer electrode 4-i (i=1 to 6) is indicated by symbol "PHi". With known structures, clock signal lines PH1 to PH6 are disposed in sequence from the side adjacent to the channel region 2 in accordance with the order of the transfer electrodes 4-1 to 4-6.

At six-phase driving, the transfer electrodes 4-1 to 4-6 are switched between on and off in sequence. In this case, the clock signal lines PH1 to PH6 are supplied with six-phase clock signals $\phi 1$ to $\phi 6$ in different phases. At two-phase driving, the transfer electrodes 4 are driven in a manner such that the odd-numbered transfer electrodes 4 come in phase, and the even-numbered transfer electrodes 4 come in phase. Specifically, clock signal lines PH1, PH3, and PH5 are supplied with a common clock signal $\phi 1'$, and clock signal lines PH2, PH4, and PH6 are supplied with a common clock signal $\phi 2'$. At three-phase driving, the transfer electrodes 4 are driven so as to be in phase every three lines. Specifically, clock signal lines PH1 and PH4 are supplied with a common clock signal $\phi 1''$, clock signal lines PH2 and PH5 are supplied with a common clock signal $\phi 2''$, and clock signal lines PH3 and PH6 are supplied with a common clock signal $\phi 3''$.

With the above structure, the clock signal lines PH1 to PH6 are disposed contiguously in parallel, thus resulting in possible crosstalk due to the capacitive coupling among them. The crosstalk among the clock signal lines may decrease the transfer efficiency of the CCD shift register. The effect of the crosstalk increases particularly between adjacent clock signal lines. Accordingly, with the structure of FIG. 1 in which clock signal lines corresponding to adjacent transfer electrodes are disposed next to each other, at the operation of transferring charge packets between the transfer electrodes, crosstalk tends to occur. The crosstalk at that case acts to weaken the fringe electric field between adjacent transfer electrodes, which may decrease the transfer efficiency.

SUMMARY OF THE INVENTION

The invention provides a CCD shift register in which a decrease in transfer efficiency due to the crosstalk among clock signal lines is reduced.

A CCD according to an aspect of the invention is formed on a semiconductor substrate. The CCD includes n clock signal lines (n is a common multiple of m and m') that apply an m-phase clock and an m'-phase clock (m and m' are natural numbers greater than or equal to two and have the relationship m≠m') selectively to a plurality of transfer electrodes disposed along a channel. The CCD can switch between m-phase driving and m'-phase driving. The n clock signal lines can be divided into m groups of n/m clock signal lines supplied with an in-phase clock at the m-phase driving. The n/m clock signal lines of each group are disposed next to each other. A pair of the clock signal lines supplied with an in-phase clock at the m'-phase driving is disposed at the position at which the groups are adjacent to each other.

A CCD according to another aspect of the invention is formed on a semiconductor substrate. The CCD includes n clock signal lines that apply m-phase clocks and n-phase clocks (m is a natural number greater than or equal to 2 and n is a multiple of m) selectively to a plurality of transfer electrodes disposed along a channel. The CCD can switch between m-phase driving and n-phase driving. The CCD includes n/m clock signal lines supplied with an in-phase clock at the m-phase driving for each phase. The in-phase n/m clock signal lines are disposed next to each other.

BRIEF DESCRIPTION OF THE DRAWINGS

FIG. 2 is a schematic plan view of the structure of a horizontal CCD shift register according to an embodiment of the invention.

DESCRIPTION OF THE PREFERRED EMBODIMENT

Figure 1:
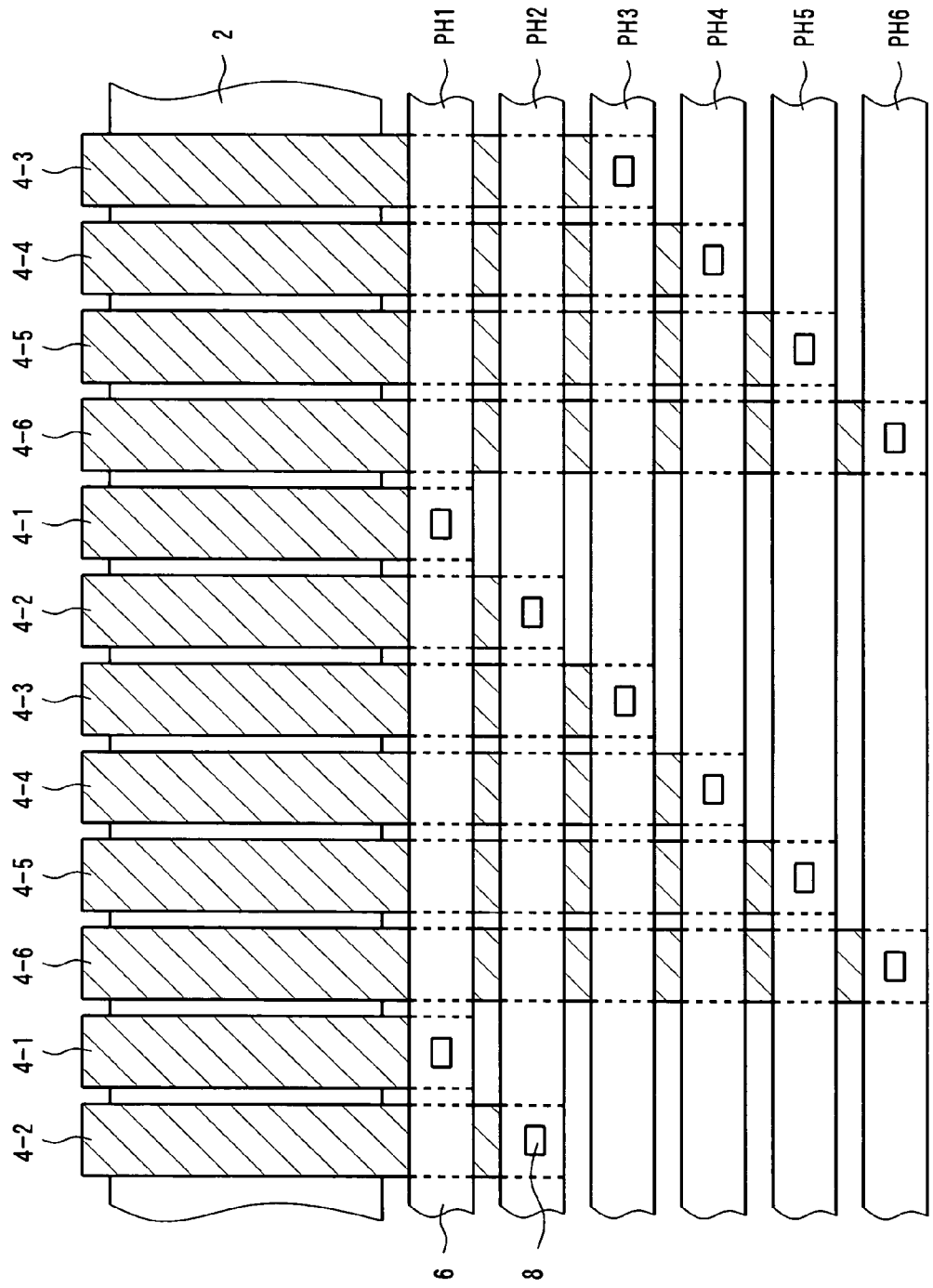
FIG. 1 is a schematic plan view of a configuration of a known horizontal shift register.

An embodiment of the invention will be described below with reference to FIG. 2. The embodiment of the invention is a horizontal CCD shift register that is a horizontal transfer portion of a CCD image sensor. FIG. 2 is a schematic plan view showing the structure of the CCD shift register according to the embodiment.

Under the transfer electrodes of the horizontal shift register, a storage section having deep channel potential and a barrier section having shallow channel potential are provided next to each other in the direction in which electric charge is transferred. Since a pair of the storage section and the barrier section causes an inclination in channel potential in the direction of the charge transfer, two-phase transfer clocks can be used to drive the horizontal shift register. With still-picture photographing, the charge packets in the horizontal shift register are transferred horizontally by two-phase driving.

On the other hand, with motion picture photographing, for example, charge packets including horizontal three pixels are combined. At the combination, six phases of transfer electrodes that include continuous three bits of horizontal shift register are driven by different clock signals. That is, at the combination, the horizontal shift register is six-phase driven. After the combination, the charge packets combined every six phases of transfer electrode are transferred horizontally by three-phase driving in which continuous three phases of transfer electrodes are driven by different clock signals.

For the multiple kinds of driving of different numbers of phases, the horizontal shift register is constructed so as to be driven by six-phase clock signals, in which six clock-signal lines are provided along a channel region 10 of the horizontal shift register.

Transfer electrodes 12-1 to 12-6 are disposed at regular intervals in this order on the channel region 10 along the direction in which charge is transferred. Each of the transfer electrodes 12 can be composed of a pair of a first polysilicon electrode layer and a second polysilicon electrode layer in order to provide a storage section and a barrier section , which is simplified in FIG. 2.

Outside the channel region 10, local oxidation of silicon (LOCOS) is formed, on which a set of clock signal lines 14 is disposed to provide clocks to a group of transfer electrodes. For two-phase driving, three-phase driving, and six-phase driving, the one set of clock signal lines 14 is composed of six clock signal lines, which are arranged in parallel with each other along the channel region 10. The transfer electrodes 12-1 to 12-6 connect to the different clock signal lines 14 via a contact 16. Here, a clock signal line 14 connected to a transfer electrode 12-i (i=1 to 6) is indicated by symbol "PHi".

Clock signal lines PH1 to PH6 are disposed such that two signal lines, that are supplied with a common clock signal at three-phase driving, are adjacent to each other. For example, clock signal lines PH1 and PH4 that apply a clock signal $\phi 1''$ to the transfer electrodes 12-1 and 12-4 at three-phase driving are disposed side by side; clock signal lines PH2 and PH5 that apply a clock signal $\phi 2''$ to the transfer electrodes 12-2 and 12-5 are disposed side by side; and clock signal lines PH3 and PH6 that apply a clock signal $\phi 3''$ to the transfer electrodes 12-3 and 12-6 are disposed side by side. In this way, three pairs of clock signal lines to be disposed side by side are determined.

Furthermore, in case that the three pairs are disposed, clock signal lines that are supplied with a common clock signal at two-phase driving are disposed at the position at which two pairs are adjacent to each other. Specifically, at two-phase driving, the clock signal lines PH1, PH3, and PH5 are supplied with an in-phase clock signal $\phi 1'$, and the clock signal lines PH2, PH4, and PH6 are supplied with an in-phase clock signal $\phi 2'$.

FIG. 2 shows an example in which a first pair of PH1 and PH4 at three-phase driving, a second pair of PH2 and PH5, and a third pair of PH3 and PH6 are disposed in sequence from the position close to the channel region 10. Assuming that a clock signal line closest to the channel region 10 is PH1, PH 4 is disposed next to that. Of the second pair disposed next to the first pair, PH2 comes in phase as that of PH4 at two-phase driving. Accordingly, a pair of PH4 and PH2 is disposed at the position at which the first pair and the second pair are adjacent to each other. Specifically, PH2 is disposed next to PH4, next to which PH5 is disposed. Likewise, of the third pair disposed next to the second pair, PH3 comes in phase as that of PH5 at two-phase driving. Accordingly, a pair of PH5 and PH3 is disposed at the position at which the second pair and the third pair are adjacent to each other. Specifically, PH3 is disposed next to PH5, next to which PH6 is disposed. In this manner, PH1, PH4, PH2, PH5, PH3, and PH6 are disposed in sequence from the position close to the channel region 10.

With this arrangement, for each clock signal line, only one of two clock signal lines disposed next to the relevant clock signal line is supplied with a clock signal in a phase different from the relevant clock signal line at both of the three-phase driving and two-phase driving, thus reducing the effect of crosstalk from the neighboring clock signal lines.

At six-phase driving, the transfer electrodes 12-1 to 12-6 are switched between on and off in sequence. In this case, the clock signal lines PH1 to PH6 are supplied with six-phase clock signals $\phi 1$ to $\phi 6$ in different phases.

The structure of the horizontal shift register that supports two-phase driving, three-phase driving, and six-phase driving has been described above. For a horizontal shift register that switches only between three-phase driving and six-phase driving, the condition that two clock signal lines that come in phase at three-phase driving need to be disposed next to each other is imposed, but there is no need to consider the condition on the arrangement of the three pairs of clock signal lines. More specifically, the pair of PH1 and PH4, the pair of PH2 and PH5, and the pair of PH3 and PH6 have only to be disposed next to each other, but there is no need to dispose PH4 and PH2, and PH5 and PH3 next to each other.

For a horizontal shift register that switches only two-phase driving and six-phase driving, three clock signal lines that come in phase at two-phase driving are disposed next to each other.

A CCD according to an aspect of the invention is formed on a semiconductor substrate. As will be understood from the above description, the CCD includes n clock signal lines (n is a common multiple of m and m') that apply an m-phase clock and an m'-phase clock (m and m' are natural numbers greater than or equal to two and have the relationship m≠m') selectively to a plurality of transfer electrodes disposed along a channel. The CCD can switch between m-phase driving and m'-phase driving. The n clock signal lines can be divided into m groups of n/m clock signal lines supplied with an in-phase clock at the m-phase driving. The n/m clock signal lines of each group are disposed next to each other. A pair of the clock signal lines supplied with an in-phase clock at the m'-phase driving is disposed at the position at which the groups are adjacent to each other.

With the structure, n/m clock signal lines that come in phase at m-phase driving are disposed next to each other, preventing crosstalk among clock signal lines in each group. At m'-phase driving, adjacent two clock signals disposed at the position at which two groups are adjacent to each other come in phase, thus reducing crosstalk therebetween.

The CCD shift register shown in FIG. 2 has a structure in which n is the least common multiple of m and m'; m is an odd number; and m' is 2. With this structure, the groups of clock signal lines that come in phase at m-phase driving are each composed of two clock signal lines. At m'-phase driving, the two clock signal lines come out of phase, while they come in phase with the clock signal lines of the other groups adjacent thereto on opposite sides, thus reducing crosstalk.

The CCD shift register shown in FIG. 2 has a structure in which m is 3; m' is 2, and n is 6. Specifically, FIG. 2 shows a CCD formed on a semiconductor substrate, the CCD including six clock signal lines that apply a two-phase clock and a three-phase clock selectively to a plurality of transfer electrodes disposed along a channel, and being capable of switching between two-phase driving and three-phase driving. In the structure shown in FIG. 2, the i-th clock signal line (i is a natural number smaller than or equal to six) of the clock signal lines connects to the (6μ+i)-th transfer electrode along the channel (μ is an integer greater than or equal to zero); the j-th clock signal line and the (j+3)-th clock signal line (j=1, 2, 3) are adjacent to each other; a pair of the 2 k-th clock signal lines (k=1, 2, 3) is adjacent to each other; and a pair of (2 k−1)-th clock signal lines is adjacent to each other.

A CCD according to another aspect of the invention is formed on a semiconductor substrate. The CCD includes n clock signal lines that apply m-phase clocks and n-phase clocks (m is a natural number greater than or equal to 2 and n is a multiple of m) selectively to a plurality of transfer electrodes disposed along a channel. The CCD can switch between m-phase driving and n-phase driving. The CCD includes n/m clock signal lines supplied with an in-phase clock at the m-phase driving for each phase. The in-phase n/m clock signal lines are disposed next to each other.

With this structure, n/m clock signal lines that come in phase at m-phase driving are disposed next to one another, thus preventing crosstalk in each group of the clock signal lines.

Specifically, the CCD shift register shown in FIG. 2 has a structure in which m is 3, and n is 6. More specifically, FIG. 2 shows a CCD formed on a semiconductor substrate, the CCD including six clock signal lines that apply a three-phase clock and a six-phase clock selectively to a plurality of transfer electrodes disposed along a channel, and being capable of switching between three-phase driving and six-phase driving. In the structure shown in FIG. 2, the i-th clock signal line (i is a natural number smaller than or equal to six) of the clock signal lines connects to the (6μ+i)-th transfer electrode along the channel (μ is an integer greater than or equal to zero); and the j-th clock signal line and the (j+3)-th clock signal line (j=1, 2, 3) are adjacent to each other.

According to the invention as described above, the crosstalk between adjacent clock signal lines can be reduced owing to the arrangement of the clock signal lines, so that a decrease in transfer efficiency is reduced.

What is claimed is:

1. A charge-coupled device on a semiconductor substrate, the charge-coupled device comprising:

n clock signal lines (n is a common multiple of m and m') that apply an m-phase clock and an m'-phase clock (m and m' are natural numbers greater than or equal to two and have the relationship m≠m') selectively to a plurality of transfer electrodes disposed along a channel, the charge-coupled device being capable of switching between m-phase driving and m'-phase driving, wherein the n clock signal lines are disposed next to each other in the group of n/m lines supplied with an in-phase clock at the m-phase driving; and a pair of the clock signal lines supplied with an in-phase clock at the m'-phase driving is disposed at the position at which the groups are adjacent to each other.

2. The charge-coupled device according to claim 1, wherein n is the least common multiple of m and m';

m is an odd number; and m' is 2.

3. A charge-coupled device on a semiconductor substrate, the charge-coupled device comprising:

six clock signal lines that apply a two-phase clock and a three-phase clock selectively to a plurality of transfer electrodes disposed along a channel, the charge-coupled device being capable of switching between two-phase driving and three-phase driving, wherein the i-th clock signal line (i is a natural number smaller than or equal to six) of the clock signal lines connects to the (6μ+i)-th transfer electrode along the channel (μ is an integer greater than or equal to zero);

the j-th clock signal line and the (j+3)-th clock signal line (j=1, 2, 3) are adjacent to each other;

a pair of the 2k-th clock signal lines (k=1, 2, 3) is adjacent to each other; and a pair of (2k−1)-th clock signal lines is adjacent to each other.

4. A charge-coupled device on a semiconductor substrate, the charge-coupled device comprising:

n clock signal lines that apply m-phase clocks and n-phase clocks (m is a natural number greater than or equal to 2 and n is a multiple of m) selectively to a plurality of transfer electrodes disposed along a channel, the charge-coupled device being capable of switching between m-phase driving and n-phase driving, wherein the n clock signal lines are disposed next to each other every n/m lines supplied with an in-phase clock at the m-phase driving.

5. A charge-coupled device on a semiconductor substrate, the charge-coupled device comprising:

six clock signal lines that apply a three-phase clock and a six-phase clock selectively to a plurality of transfer electrodes disposed along a channel, the charge-coupled device being capable of switching between three-phase driving and six-phase driving, wherein the i-th clock signal line (i is a natural number smaller than or equal to six) of the clock signal lines connects to the $(6\mu+i)$-th transfer electrode along the channel ($\mu$ is an integer greater than or equal to zero); and the j-th clock signal line and the (j+3)-th clock signal line (j=1, 2, 3) are adjacent to each other.

* * * * *